US008429581B2

(12) United States Patent
Boehm

(10) Patent No.: US 8,429,581 B2
(45) Date of Patent: Apr. 23, 2013

(54) METHOD FOR VERIFYING FUNCTIONAL EQUIVALENCE BETWEEN A REFERENCE IC DESIGN AND A MODIFIED VERSION OF THE REFERENCE IC DESIGN

(75) Inventor: Fritz A. Boehm, Dripping Springs, TX (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/215,284

(22) Filed: Aug. 23, 2011

(65) Prior Publication Data

US 2013/0055174 A1 Feb. 28, 2013

(51) Int. Cl.
*G06F 17/50* (2006.01)
(52) U.S. Cl.
USPC .............. 716/107; 716/106; 716/136; 703/14
(58) Field of Classification Search .......... 716/106–107, 716/136
See application file for complete search history.

(56) References Cited

U.S. PATENT DOCUMENTS

| 5,329,471 | A | * | 7/1994 | Swoboda et al. ............... 703/23 |
|---|---|---|---|---|
| 6,363,509 | B1 | * | 3/2002 | Parulkar et al. ............... 714/738 |
| 6,634,012 | B2 | * | 10/2003 | Zhong et al. ................. 716/106 |
| 6,678,645 | B1 | * | 1/2004 | Rajsuman et al. ............. 703/20 |
| 7,003,743 | B2 | | 2/2006 | Abadir |
| 7,219,315 | B1 | * | 5/2007 | Stoye et al. ................... 716/136 |
| 7,447,621 | B1 | * | 11/2008 | Lam et al. ..................... 703/22 |
| 7,480,606 | B2 | * | 1/2009 | Tseng et al. ................... 703/14 |
| 7,623,981 | B2 | * | 11/2009 | Achkar et al. ................. 702/108 |
| 7,701,255 | B2 | * | 4/2010 | Cortadella et al. ............. 326/93 |
| 7,761,272 | B1 | * | 7/2010 | Janneck et al. ................. 703/13 |
| 7,779,378 | B2 | | 8/2010 | Baumgartner |
| 7,904,850 | B2 | * | 3/2011 | Spackman et al. ............. 717/136 |
| 7,979,833 | B2 | * | 7/2011 | Mohiuddin et al. ........... 716/136 |
| 8,121,825 | B2 | * | 2/2012 | Jain et al. ...................... 703/14 |
| 2003/0217345 | A1 | * | 11/2003 | Rajsuman et al. ............. 716/6 |
| 2006/0117274 | A1 | * | 6/2006 | Tseng et al. ................... 716/1 |
| 2008/0216031 | A1 | | 9/2008 | Dalton |
| 2008/0306721 | A1 | * | 12/2008 | Yang ............................. 703/14 |
| 2009/0105970 | A1 | * | 4/2009 | Kodera et al. ................. 702/58 |
| 2011/0035203 | A1 | * | 2/2011 | Dalton et al. .................. 703/14 |

OTHER PUBLICATIONS

Susanto et al; "Design Validation by Symbolic Simulation and Equivalence Checking: A Case Study in Memory Optimization for Image Manipulation;" SOFSEM '09 Proceedings of the 35th Conference on Current Trends in Theory and Practice of Computer Science; London, England, Jan. 2009.

* cited by examiner

*Primary Examiner* — Naum Levin
(74) *Attorney, Agent, or Firm* — Meyertons, Hood, Kivlin, Kowert & Goetzel, P.C.; Stephen J. Curran

(57) ABSTRACT

A method for verifying functional equivalence between a reference integrated circuit (IC) design and a modified version of the reference IC design includes simulating a reference IC design using a simulation stimulus on a test bench and saving the simulation output. The reference IC design corresponds to an IC design model having visibility to comprehensive internal device state. The method may also include simulating a modified version of the reference IC design using the same simulation stimulus on the same test bench, and saving the modified version simulation output. In addition, the simulation outputs of the reference IC design and the modified version are compared to create a comparison result. Lastly, the method may include determining whether the modified version of the reference IC design is functionally equivalent to the reference IC design based upon the comparison result.

20 Claims, 5 Drawing Sheets

METHOD FOR VERIFYING FUNCTIONAL EQUIVALENCE BETWEEN A REFERENCE IC DESIGN AND A MODIFIED VERSION OF THE REFERENCE IC DESIGN

BACKGROUND

1. Technical Field

This disclosure relates to integrated circuit (IC) design, and more particularly to functional equivalence verification of integrated circuit logic designs.

2. Description of the Related Art

In IC design, when a reference design must be modified, in some cases it is desirable and indeed necessary to prove that the modified version of the reference IC design is functionally equivalent through a formal approach. This is sometimes necessary to ensure that no bugs have been created when the design was altered.

There are many approaches to formally proving that modifications to the design are functionally equivalent. These formal proofs can be time-consuming and resource intensive. Accordingly, it may be desirable to allow a designer to have high confidence that the modified design is functionally equivalent to the reference design in a short amount of time, even if the process does not formally prove that the change is equivalent. This may allow for more progress to be made while still catching many faults.

A conventional approach involves running the original reference design alongside the modified design in a lockstep simulation. This involves stimulating the designs identically, and then checking a set of outputs at each cycle to ensure that both designs behave identically for the stimulus that has been applied.

However, although this approach may be effective at finding faults, it has several drawbacks. More particularly, at build time two copies of the model must be built, which takes more time and more processing memory. In addition, at run time simulating two designs simultaneously (i.e., co-simulation) takes much more time and more memory. Furthermore, the simulation model must be maintained as the project progresses.

SUMMARY OF THE EMBODIMENTS

Various embodiments of a method for verifying functional equivalence between a reference integrated circuit (IC) design and a modified version of the reference IC design are disclosed. In one embodiment, the method includes simulating a reference IC design using a simulation stimulus on a test bench and saving the simulation output. The reference IC design corresponds to an IC design model having visibility to comprehensive internal device state. For example, the reference IC design may correspond to a gate-level or transistor-level netlist in various implementations. The method may also include simulating a modified version of the reference IC design using the same simulation stimulus on a same test bench, and saving the modified version simulation output. The method may also include comparing simulation outputs of the reference IC design and the modified version to create a comparison result. Lastly, the method may include determining whether the modified version of the reference IC design is functionally equivalent to the reference IC design based upon the comparison result.

In one specific implementation, the method may also include simulating the reference IC design one time for a given simulation stimulus, and reusing the reference IC design simulation output for one or more subsequent comparisons with one or more modified version simulation outputs.

Figure 1:
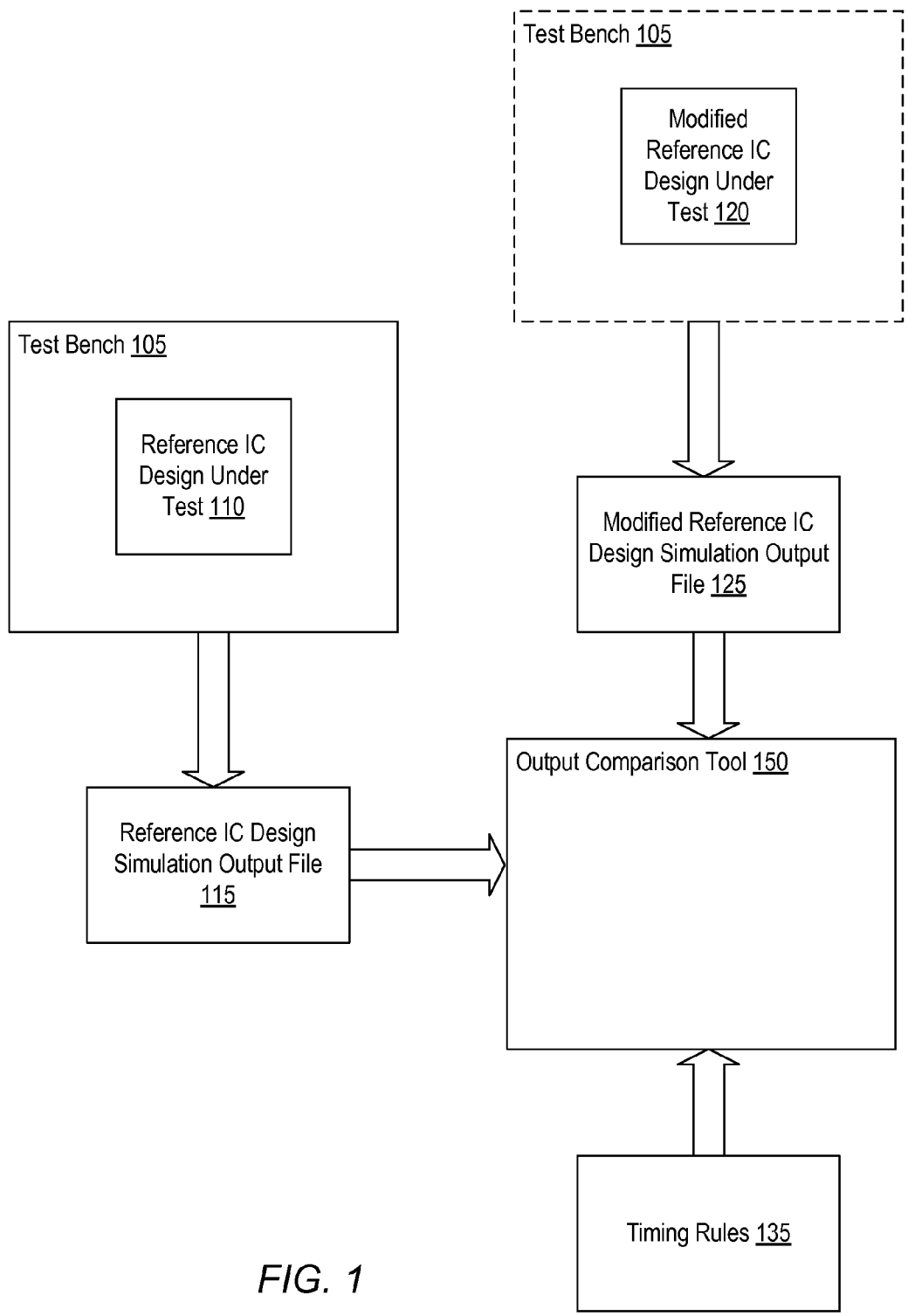
FIG. 1 is a conceptual diagram depicting one embodiment of a process for verifying functional equivalence between a reference integrated circuit (IC) design and a modified version.

Specific embodiments are shown by way of example in the drawings and will herein be described in detail. It should be understood, however, that the drawings and detailed description are not intended to limit the claims to the particular embodiments disclosed, even where only a single embodiment is described with respect to a particular feature. On the contrary, the intention is to cover all modifications, equivalents and alternatives that would be apparent to a person skilled in the art having the benefit of this disclosure. Examples of features provided in the disclosure are intended to be illustrative rather than restrictive unless stated otherwise.

As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six, interpretation for that unit/circuit/component.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

DETAILED DESCRIPTION

Turning now to FIG. 1, a conceptual diagram depicting one embodiment of a process for verifying functional equivalence between a reference integrated circuit (IC) design and a modified version is shown. The reference IC design under test 110 is simulated using a test bench 105. The test bench 105 may apply a stimulus to the reference IC design under test 110. The stimulus is typically a predetermined group of signals and or instructions, for example. The test bench 105 may also monitor and record the results of the simulation in an output file 115.

The output file 115 may be formatted in a variety of different formats, depending, for example, on the use of the file. In one embodiment, the output file may be a value change dump (VCD) file. A VCD file is a standardized simulation output that typically includes some header information and a value change section that includes a number of time-ordered value changes for the signals in the simulation model.

Additionally, a modified reference IC design under test 120 may be simulated using the same test bench 105 that was used to simulate the reference IC design. The same stimulus is also applied to the modified version 120. The simulation results of the modified reference IC design 120 are saved to an output file 125.

The reference IC design may be a design golden model that provides visibility to the comprehensive internal device state. In one embodiment, comprehensive internal device state may refer to the state that is visible at any node or net in the design. More particularly, depending on what level of representation (e.g., register transfer level (RTL), gate-level, or transistor-level netlist) is being simulated, it may be possible to observe signals at any node or device in the design. This is contrasted with an architectural model in which only programmer visible state is typically observable. Programmer visible state generally refers to the device state that is accessible via structures such as control registers, model specific registers, and other specific and predetermined access points in a given design. Thus, the programmer visible state may be a subset of the comprehensive internal device state.

An output comparison tool 150 may compare the two output files to determine if they are the same, in which case it would be determined that the designs are functionally equivalent for the given stimulus and the signals and state that is checked. As shown, the output comparison tool 150 may access a set of timing rules 135 that may provide timing and comparison override information. In one embodiment, the timing rules 135 may include information to allow differences in signal timing between the two output files. For example, a state on a given signal in the modified reference IC design output file may occur one clock cycle before or after the same state on the same signal in the reference IC design output file. This difference can be specified in the timing rules, which may allow the comparison tool 150 to allow the difference. Similarly, the timing rules 135 may include certain overrides or "don't cares" to be used for certain signals. For example, if a given result in an arithmetic unit is a result of a divide by zero operation, the actual result is irrelevant in either simulation so that value could be disregarded.

As described in more detail below, the reference IC design may be modified and re-simulated on the test bench 105 any number of times during the design cycle. However, the reference IC design need only be simulated with a given stimulus one time and the output file 115 with the simulation results may be reused for comparison with the results of each simulation of a modified design using the same stimulus.

It is noted that the order in which the designs are simulated is irrelevant. In other words, since the results of the simulations may be post-processed, it doesn't matter which of the reference IC design or the modified reference IC design is simulated first.

Figure 2:
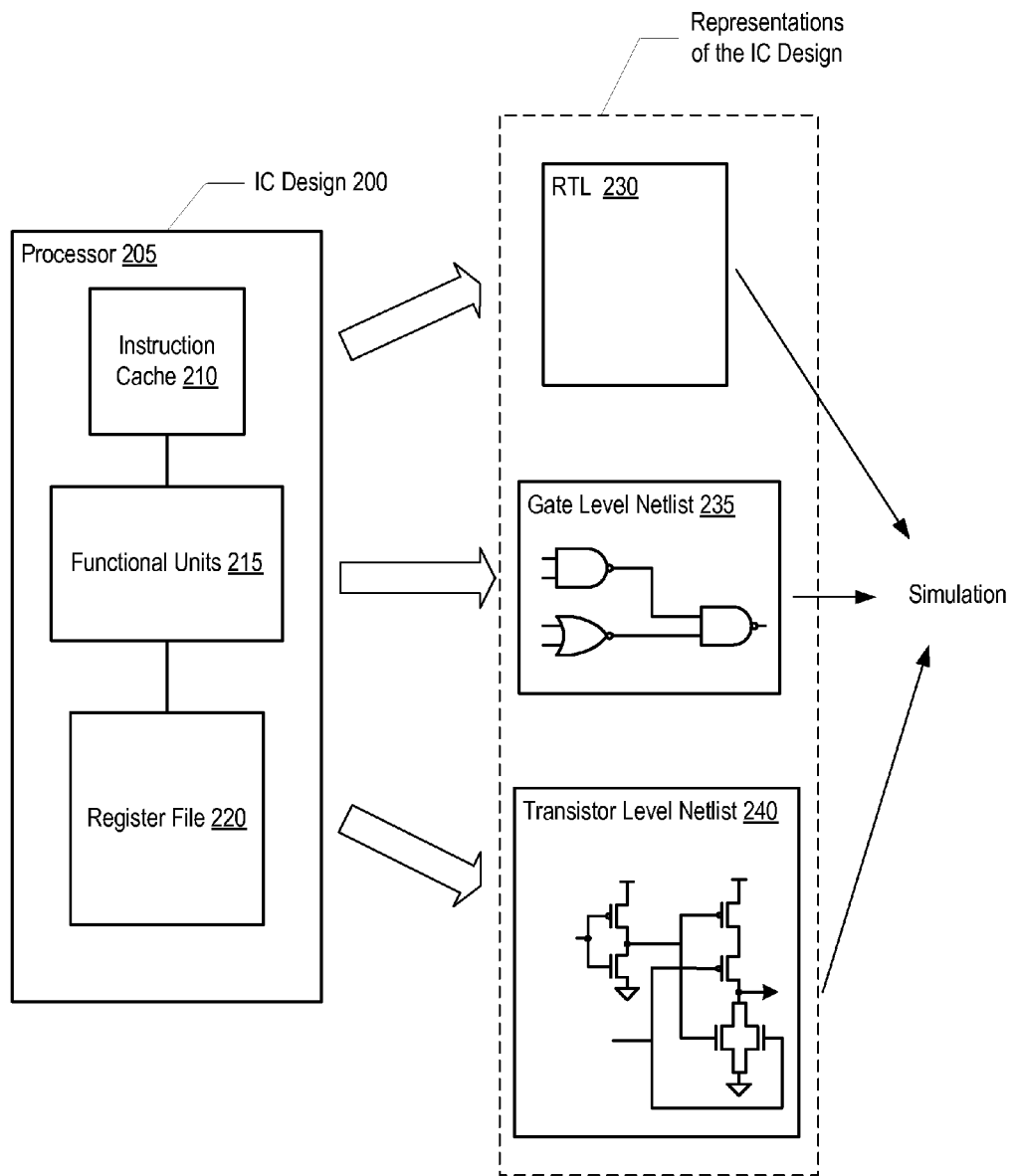
FIG. 2 is a diagram depicting an embodiment of an IC design and a number of different representations of the IC design.

Referring to FIG. 2, a diagram depicting an embodiment of an IC design and a number of different representations of the IC design is shown. The IC design 200 corresponds to a processor 205. The processor 205 includes an instruction cache 210, functional units 215, and a register file 220. It is noted that the processor 205 may have many more components that have been omitted here for simplicity.

As shown, the IC design 200 may be represented in a number of different ways. For example, the IC design may be represented as an RTL representation. Alternatively, the IC design 200 may be represented as a gate-level netlist 235. In addition, the IC design 200 may be represented as a transistor level netlist 240. It is noted that other representations are possible and contemplated.

As mentioned above, each of the illustrated representations may be simulated on a test bench (e.g., test bench 105 of FIG. 1). Dependent upon which of the representations is simulated, the results of the simulation may include state information for any of a variety of signals, and at any of a number of hierarchies within the processor 205. More particularly, if a transistor-level netlist 240 of the processor 205 is simulated, the results may include state information for any node in the entire design, while an RTL 230 simulation may not provide quite the same level of granularity.

Figure 3A:
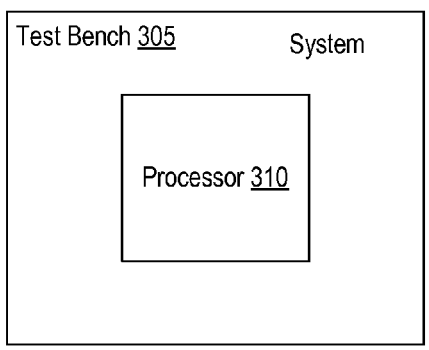
FIG. 3A is a block diagram depicting one embodiment of a test bench for simulating an IC design at one level of hierarchy.
Figure 3B:
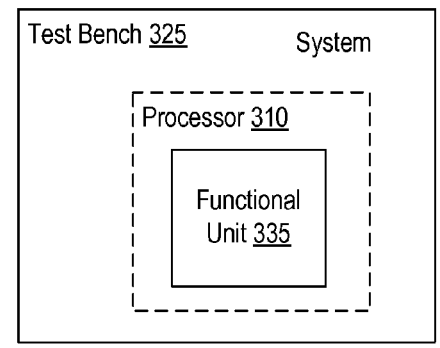
FIG. 3B is a block diagram depicting one embodiment of a test bench for simulating an IC design at another level of hierarchy.

In addition, as shown in FIG. 3A and FIG. 3B, the test bench that is used to simulate a given design may include different levels of logic depending on the level of hierarchy of the design within the context of the system.

Turning to FIG. 3A, a block diagram depicting one embodiment of a test bench for simulating an IC design at one level of hierarchy is shown. The test bench 305 includes logic that interfaces to a processor 310. In other words, as shown in FIG. 3A, the test bench performs the functionality and provides the stimulus of the system in which the processor 310 may reside. Thus, in this case, the functionality of the entire processor 310 may be simulated.

Referring to FIG. 3B, a block diagram depicting one embodiment of a test bench for simulating an IC design at another level of hierarchy is shown. In FIG. 3B, the test bench 325 includes system logic and some of the logic of the processor 310. In this case, the reference IC design being simulated is the functional unit 335. Accordingly, the test bench 325 now includes functionality and stimulus of the system in which the processor 310 resides, as well as the functionality and stimulus of the processor 310 that interfaces to the functional unit 335.

Figure 4:
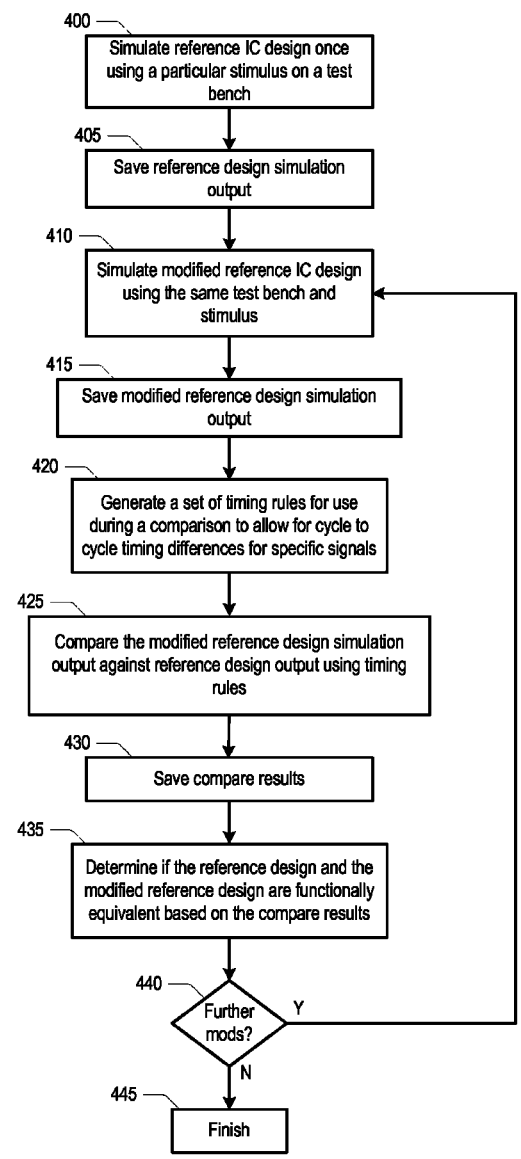
FIG. 4 is a flow diagram describing a method for verifying functional equivalence between a reference IC design and a modified version of the reference IC design.

In FIG. 4, a flow diagram describing a method for verifying functional equivalence between a reference IC design and a modified version of the reference IC design is shown. Referring collectively to FIG. 1 through FIG. 4, and beginning in block 400 of FIG. 4, a reference IC design is simulated on a test bench such as test bench 105 of FIG. 1, for example, using a particular stimulus. As described above, the reference IC design may be represented in any of a variety of ways, depending on the level of granularity of the internal device state that a designer may wish to access. The simulation results may be saved in an output file and stored (block 405).

In one embodiment, the output file may be formatted as a VCD file, although other file types may be used as desired.

The modified reference IC design may also be simulated using the same test bench and stimulus that was used to simulate the reference IC design (block 410). The simulation output is also saved in an output file having the same format as the reference IC design output file (block 415). In one embodiment, a set of timing rules may be generated to allow differences in event timing on one or more of the signals between the output files (block 420). The timing rules may also specify don't care conditions for one or more signals.

The output files are compared to determine if they are the same (block 425). In one embodiment, the timing rules may be applied to the comparison so that predetermined differences in certain signal events may be overlooked. Similarly, if there are signals that don't matter, the don't care conditions may be applied. The compare results may be saved (block 430). In one embodiment, a comparison tool may be used to do the comparison in a automated way. Based on the results of the comparison, if the output files are the same, or if they are the same after application of the timing rules, it may be determined that the reference IC design and the modified reference IC design are functionally equivalent (block 435).

If there are no further modifications to be performed (block 440), the verification is complete (block 445). However, if additional modifications to the reference IC design are desired, the modifications can be performed (block 440), and the newly modified reference IC design can be simulated again using the same test bench and stimulus as described above in conjunction with the description of block 410. Operation proceeds as described above. It is noted that, if the stimulus that is used to simulate any modified reference IC design must be changed, then the reference IC design must be re-simulated using that same stimulus.

Figure 5:
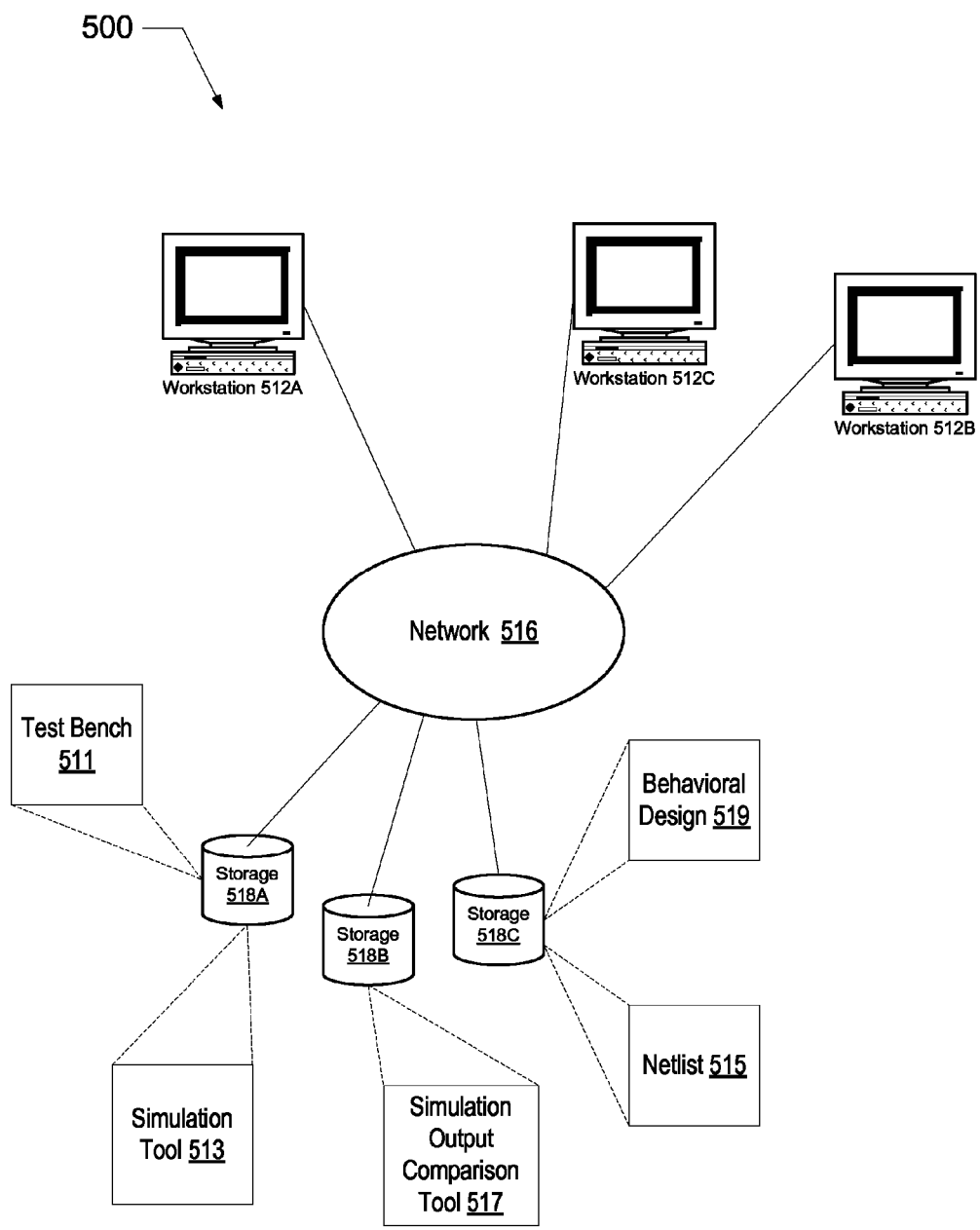
FIG. 5 is a block diagram of one embodiment of a system for implementing a tool verifying functional equivalence between a reference IC design and a modified version of the reference IC design.

Turning to FIG. 5, a block diagram of one embodiment of a system for implementing a tool for performing functional equivalence between a reference IC design and a modified version of the reference IC design is shown. Computer system 500 includes a plurality of workstations designated 512A through 512C. The workstations are coupled together through a network 516 and to a plurality of storages designated 518A through 518C. In one embodiment, each of workstations 512A-512C may be representative of any standalone computing platform that may include, for example, one or more processors, local system memory including any type of random access memory (RAM) device, monitor, input output (I/O) means such as a network connection, mouse, keyboard, monitor, and the like (many of which are not shown for simplicity).

In one embodiment, storages 518A-518C may be representative of any type of non-transitory computer readable storage device such as hard disk systems, optical media drives, tape drives, ram disk storage, and the like. As such, the program instructions comprising the design tools may be stored within any of storages 518A-518C and loaded into the local system memory of any of the workstations during execution. As an example, as shown in FIG. 5, the test bench tool 511 and the simulation tool 513 are shown stored within storage 518A, while the netlist(s) 515 is stored within storage 518C, along with behavioral design 519. Further, the simulation output comparison tool 517 is stored within storage 518B. Additionally, the program instructions may be stored on a portable/removable storage media. The program instructions may be executed directly from the removable media or transferred to the local system memory of a given workstation 512 or mass storages 518 for subsequent execution. As such, the portable storage media, the local system memory, and the mass storages may be referred to as non-transitory computer readable storage mediums. The program instructions may be executed by the one or more processors on a given workstation or they may be executed in a distributed fashion among the workstations, as desired.

In one embodiment, once the reference IC design and the modified reference IC design have been simulated and their respective simulation outputs have been stored, the simulation output comparison tool 517 may be used to determine whether the reference IC design is functionally equivalent to the modified version of the reference IC design. In addition, as described above, the reference IC design may be modified and simulated as many times as desired, and the simulation output comparison tool 517 may be used to compare each new simulation output to the saved simulation output of the reference IC design. In one embodiment, the simulation output comparison tool 517 may include program instructions written in any of a variety of programming languages or scripting languages, and which may be executable by a processor to perform the above tasks.

It is noted that although the computer system shown in FIG. 5 is a networked computer system, it is contemplated that in other embodiments, each workstation may also include local mass storage. In such embodiments, the program instructions and the results of the design tools may be stored locally. Further, it is contemplated that the program instructions may be executed on a standalone computer such as a personal computer that may include local mass storage and a system memory.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method comprising:
    simulating, by a computer, a reference integrated circuit (IC) design using a simulation stimulus on a simulation test bench, wherein the reference IC design corresponds to an IC design model having visibility to comprehensive internal device state, which is visible at any node in the reference IC design;
    saving a reference IC design simulation output;
    simulating, by a computer, a modified version of the reference IC design using a same simulation stimulus on a same simulation test bench;
    saving a simulation output of the modified version of the reference IC design;
    comparing the modified version simulation output to the reference IC design simulation output;
    determining whether the modified version of the reference IC design is functionally equivalent to the reference IC design based upon a result of the comparison.

2. The method as recited in claim 1, further comprising simulating the reference IC design one time for a given simulation stimulus, and reusing the reference IC design simulation output for one or more subsequent comparisons with one or more modified version simulation outputs.

3. The method as recited in claim 2, further comprising generating one or more timing rules that specify timing variances between one or more signals of the modified version of the reference IC design and the same one or more signals of the reference IC design.

4. The method as recited in claim 3, further comprising applying the one or more timing rules during to the comparison to allow cycle to cycle timing differences between one or more signals of the modified version of the reference IC design and the same one or more signals of the reference IC design to indicate functional equivalence.

5. The method as recited in claim 1, further comprising comparing comprehensive internal device state of both of the reference IC design and the modified version of the reference IC design.

6. The method as recited in claim 1, further comprising selecting one or more specific signals in the simulation output from all possible signals to compare.

7. The method as recited in claim 1, wherein the reference IC design comprises a register transfer level design.

8. The method as recited in claim 1, wherein the reference IC design comprises a gate level netlist.

9. The method as recited in claim 1, wherein reference IC design comprises a transistor level netlist.

10. A non-transitory computer readable storage medium including program instructions for checking functional equivalence between a reference integrated circuit (IC) design and a modified version of the reference IC design, the program instructions are executable by a processor to:
   simulate the reference IC design using a simulation stimulus on a test bench, wherein the reference IC design corresponds to an IC design model having visibility to comprehensive internal device state, which is visible at any node in the reference IC design;
   save a reference IC design simulation output;
   simulate the modified version of the reference IC design using a same simulation stimulus on a same test bench;
   save a simulation output of the modified version of the reference IC design;
   compare the modified version simulation output to the reference IC design simulation output to create a comparison result;
   determine whether the modified version of the reference IC design is functionally equivalent to the reference IC design based upon the comparison result.

11. The computer readable storage medium as recited in claim 10, wherein the program instructions are further executable by the processor to reuse the reference IC design simulation output for one or more subsequent comparisons with one or more modified version simulation outputs.

12. The computer readable storage medium as recited in claim 10, wherein the program instructions are further executable by the processor to generate a set of timing rules that specify timing variances between events occurring on one or more signals of the modified version of the reference IC design and the same one or more signals of the reference IC design.

13. The computer readable storage medium as recited in claim 10, wherein the program instructions are further executable by the processor to compare comprehensive internal device state of both of the reference IC design and the modified version of the reference IC design.

14. A system comprising:
   a memory storing program instructions for checking functional equivalence between a reference integrated circuit (IC) design and a modified version of the reference IC design;
   a processor coupled to the memory, wherein the processor, in response to executing the instructions is configured to:
      simulate the reference IC design using a simulation stimulus on a test bench, wherein the reference IC design corresponds to an IC design model having visibility to comprehensive internal device state, which is visible at any node in the reference IC design;
      save a reference IC design simulation output;
      simulate the modified version of the reference IC design using a same simulation stimulus on a same test bench;
      save a simulation output of the modified version of the reference IC design;
      compare the modified version simulation output to the reference IC design simulation output to create a comparison result;
      determine whether the modified version of the reference IC design is functionally equivalent to the reference IC design based upon the comparison result.

15. The system as recited in claim 14, wherein the processor is further configured to perform the comparison between the same reference IC design simulation output and one or more modified version simulation outputs.

16. The system as recited in claim 14, wherein the processor is further configured to apply a set of timing rules during the comparison, wherein the set of timing rules specify timing variances between events occurring on one or more signals of the modified version of the reference IC design and the same one or more signals of the reference IC design.

17. A method comprising:
   simulating, by a computer, a reference integrated circuit (IC) design using a simulation stimulus on a test bench, wherein the reference IC design corresponds to an IC design model having visibility to comprehensive internal device state, which is visible at any node in the reference IC design;
   saving a simulation output of the reference IC design;
   simulating, by a computer, one or more modified versions of the reference IC design using a same simulation stimulus on a same test bench;
   saving a simulation output of each of one or more modified versions of the reference IC design;
   comparing the simulation output of each modified version to the simulation output of the reference IC design to create a comparison result corresponding to each comparison;
   determining whether any of the modified versions of the reference IC design are functionally equivalent to the reference IC design based upon the comparison results.

18. The method as recited in claim 17, further comprising generating a timing file including one or more timing rules that specify timing variances between events occurring on one or more signals of the modified version of the reference IC design and the same one or more signals of the reference IC design.

19. The method as recited in claim 18, wherein the timing file further includes one or more override conditions which cause one or more specified events occurring on one or more signals of the modified version of the reference IC design and the same one or more specified events of the reference IC design to be ignored.

20. The method as recited in claim 17, further comprising applying the one or more timing rules during each comparison to allow cycle to cycle timing differences between one or more signals of the modified version of the reference IC design and the same one or more signals of the reference IC design.

* * * * *